United States Patent [19]

Hirabayashi et al.

[11] Patent Number: 5,445,851
[45] Date of Patent: Aug. 29, 1995

[54] METHOD FOR FORMING TABULAR DIAMOND CRYSTALS

[75] Inventors: Keiji Hirabayashi, Tokyo; Yoichi Hirose, Saitama, both of Japan

[73] Assignee: Canon Kabushiki Kaisha, Tokyo, Japan

[21] Appl. No.: 297,901

[22] Filed: Aug. 29, 1994

Related U.S. Application Data

[63] Continuation of Ser. No. 35,624, Mar. 23, 1993, abandoned.

[30] Foreign Application Priority Data

Mar. 26, 1992 [JP] Japan .................................. 4-068680

[51] Int. Cl.⁶ ........................... B05D 1/08; B05D 3/06
[52] U.S. Cl. ........................... 427/450; 427/577; 427/575; 427/573; 427/249; 427/122; 427/299; 423/446
[58] Field of Search ............... 427/577, 573, 575, 249, 427/122, 314, 299, 450; 423/446, 408; 156/DIG. 68

[56] References Cited

U.S. PATENT DOCUMENTS

| | | | |
|---|---|---|---|
| 4,932,331 | 6/1990 | Kurihara et al. | 106/286.1 |
| 4,935,303 | 6/1990 | Ikoma et al. | 428/408 |
| 4,938,940 | 7/1990 | Hirose et al. | 427/249 |
| 5,026,415 | 6/1992 | Yamamoto et al. | 65/305 |
| 5,135,730 | 8/1992 | Suzuki et al. | 423/446 |
| 5,202,156 | 4/1993 | Yamamoto et al. | 427/135 |
| 5,202,571 | 4/1993 | Hirabayashi et al. | 257/10 |

FOREIGN PATENT DOCUMENTS 2-30697 2/1990 Japan .
WO9222689 12/1992 WIPO .

OTHER PUBLICATIONS

Kung et al, "Growth of diamond thin films by spiral hollow cathode plasma-assisted chemical vapor deposition", J. Appl. Phys. 66(10), Nov. 1989, pp. 4676–4684.
Deguchi et al, "Diamond growth on carbon-implanted silicon", Appl. Surf. Sci., 60–61, pp. 291–295 (1992).
Sood et al, "The effect of carbon ion implantation on the nucleation of diamond on Ti–6Al–4V alloy", Surf. Coat. Technol, 51(1–3 pp. 307–312 (1992).
Journal of Applied Physics, May 1, 1991, DeNatale, J. F. et al., "Microstructure and Orientation Effects in Diamond Thin Films", p. 6458.
Journal of Vacuum Science and Technology, vol. 7, No. 6, Nov. 1989, pp. 1947–1949, Kirkpatrick, A. R. et al., "Focused Ion–Beam Crater arrays for Induced Nucleation of Diamond Film".
Japanese Journal of Applied Physics, Part 1, Aug. 1990, Japan, vol. 29, No. 8, 1552–1560, Matsui, Y. et al., "The Growth Mechanism of Diamond Crystals in Acetylene Flames".

Primary Examiner—Roy V. King
Attorney, Agent, or Firm—Fitzpatrick, Cella, Harper & Scinto

[57] ABSTRACT

A tabular diamond crystal is formed on a substrate by gas phase synthesis, wherein the diamond crystal has a ratio of thickness to width of from 1:4 to 1:1,000 and the surface of the substrate on which the diamond crystal has been formed and the top surface of the diamond crystal are at an angle ranging from 0° to 10°.

6 Claims, 3 Drawing Sheets

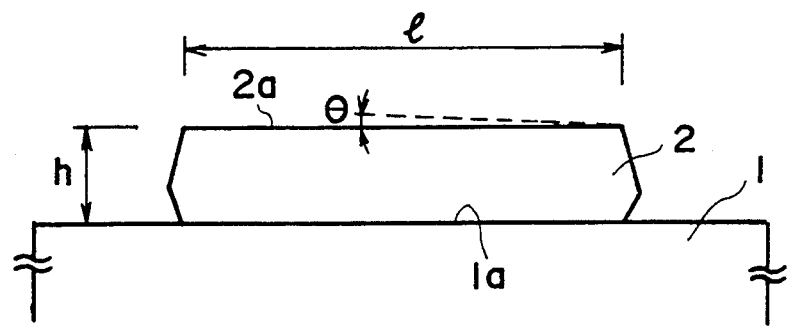
F I G. 1
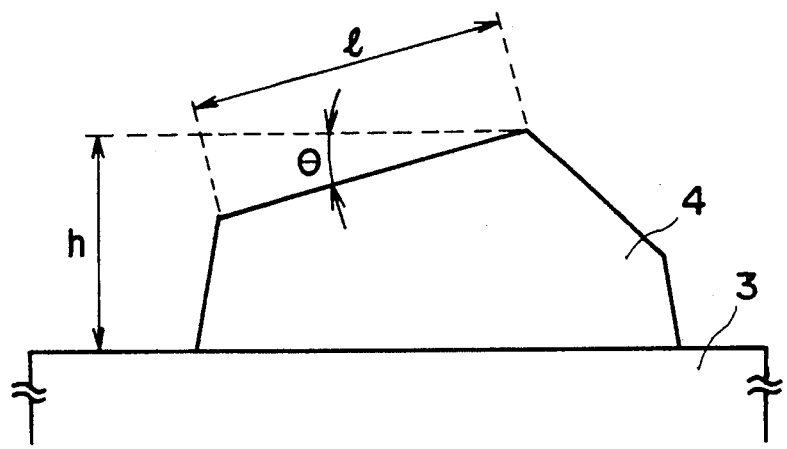
F I G. 2
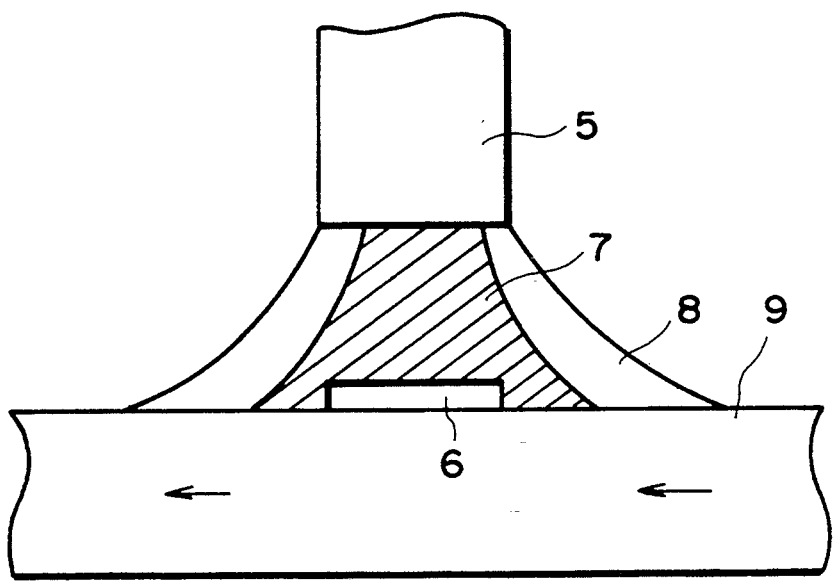
F I G. 3

METHOD FOR FORMING TABULAR DIAMOND CRYSTALS

This application is a continuation of application Ser. No. 08/035,624 filed Mar. 23, 1993, now abandoned.

BACKGROUND OF THE INVENTION

1. Field of the Invention

The present invention relates to a tabular diamond crystal having superior properties useful as an electronic material, and a method for its formation.

2. Related Background Art

Diamonds have a great band gap (5.5 ev), a great carrier mobility (electrons, 1,800 cm$^2$V.S; positive holes, 1,600 cm$^2$V.S) and a great thermal conductivity (20 W/cm.K) and also have a high hardness and superior wear resistance, which are properties that can not be achieved by other materials.

In recent years, researches are being made on syntheses of diamonds from gaseous phases, in particular, on syntheses thereof by chemical vapor deposition (CVD). Conventional diamonds formed on substrates by CVD include the following:

(1) There are those formed by homoepitaxial growth on natural or artificial diamond crystals serving as substrates, and those formed by heteroepitaxial growth on cubic crystal boron nitride (c-BN) having a crystal structure similar to that of a diamond crystal. Both of these have epitaxial relationship to the underlying substrates, and monocrystalline films with a very high flatness can be obtained.

(2) There are those formed diamonds under usual conditions on substrates including a silicon substrate, a high-melting metal such as molybdenum, tungsten or tantalum and a quartz substrate, diamonds are deposited in different forms depending on nucleation density, film thickness and other synthesis conditions.
  i) In the case when the nucleation density is low, diamond crystals are deposited in a granular form and at random in regard to orientation.
  ii) In the case when the nucleation density is high, diamond crystals are deposited in the form of polycrystalline films with a great uneveness.
  iii) Polycrystalline films predominantly having {100} planes and capable of being highly oriented can be obtained when formed with a large thickness and under specific synthesis conditions (keeping the concentration of a carbon source at a relatively high level).

(3) There are those formed by heteroepitaxial growth on nickel or cobalt substrates. On these substrates capable of forming solid solutions with carbon, diamonds partially grow epitaxially. Here, diamond crystals are deposited in a granular form at a small nucleation density, so that no uniform films are formed.

The above conventional diamond crystals have the following problems:

(1) The monocrystalline films obtained by epitaxial growth on diamond or cubic crystal boron nitride substrates can be flat and have a good crystallinity, but the substrates are so expensive that they can not be of practical use.

(2) In the formation of diamonds under usual conditions on silicon, high-melting metal or quartz substrates;
  i) in the case when the nucleation density is low, monocrystals are formed, but are deposited at random in regard to orientation and in a granular form (the ratio of height to breadth is 1:3 or less, and usually 1:2 or less);
  ii) in the case when the nucleation density is high, polycrystalline films with a great uneveness are formed; and
  iii) although the {100}-oriented films have surfaces substantially parallel to the substrates and can have regions having a good flatness, they are essentially polycrystalline films and additionally a number of crystal imperfections (defects due to dislocation, twin planes, etc.) are present in the films.

(3) In the case of the heteroepitaxial growth on nickel or cobalt substrates, although monocrystal grains having epitaxial relationship to the substrates can be obtained, they are deposited in a granular form (the ratio of height to breadth is 1:3 or less, and typically 1:2 or less). In particular, the {111} planes tend to become rough, and a number of crystal imperfections are present in the crystal.

SUMMARY OF THE INVENTION

A main object of the present invention is to provide a tabular diamond crystal useful in electronic parts or the like.

Another object of the present invention is to provide a diamond crystal which is a tabular diamond crystal formed on a substrate by gas phase synthesis, wherein the diamond crystal has a ratio of thickness to width of from 1:4 to 1:1,000 and the surface of the substrate on which the diamond crystal has been formed and the top surface of the diamond crystal are at an angle ranging from 0° to 10°.

Still another object of the present invention is to provide a method for forming the above diamond crystal by combustion flaming method carried out using oxygen and acetylene gas as a main starting material gas, wherein the oxygen and acetylene gas in the main starting material gas are controlled to be in a molar ratio of $0.9 \leq O_2/C_2H_2 \leq 1$, and the nucleation density of the diamond formed on the substrate is controlled to be $10^2$ to $1 \times 10^5$ cm$^{-2}$.

A further object of the present invention is to provide a method for forming the above tabular diamond crystal by CVD method carried out using a starting material gas comprised of at least one kind of gas and including elements of hydrogen, carbon and oxygen, wherein a carbon source in the starting material gas is controlled to be in a concentration of 0.01 to 10%, the number of oxygen atoms and that of carbon atoms in the starting material gas to be in a ratio of $0.5 \leq O/C \leq 1.2$, and the nucleation density of the diamond formed on the substrate to be $10^4$ to $2 \times 10^6$ cm$^{-2}$.

BRIEF DESCRIPTION OF THE DRAWINGS

FIG. 1 is a diagrammatic cross-sectional illustration of an example of the tabular diamond crystal of the present invention.

FIG. 2 is a diagrammatic cross-sectional illustration of a conventional granular diamond crystal.

FIG. 3 is a diagrammatic illustration of an example of the method of the present invention, carried out by combustion flaming method.

DESCRIPTION OF THE PREFERRED EMBODIMENTS

Figure 4:
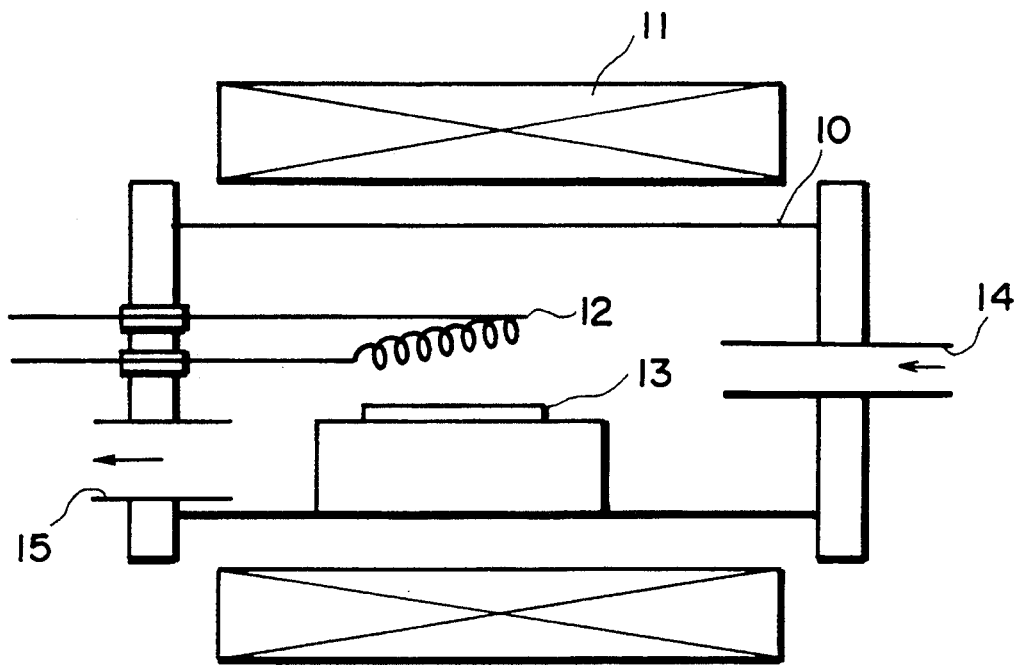
FIG. 4 is a diagrammatic illustration of a heat filament CVD apparatus used in the working of the present invention.

The diamond crystal of the present invention is characterized by a tabular diamond crystal formed on a substrate by gas phase synthesis, wherein the diamond crystal has a ratio of thickness to width of from 1:4 to 1:1,000 and the surface of the substrate on which the diamond crystal has been formed and the top surface of the diamond crystal are at an angle ranging from 0° to 10°.

A first preferred embodiment of the diamond crystal forming method of the present invention is characterized by a method for forming the above diamond crystal by combustion flaming method carried out using oxygen and acetylene gas as a main starting material gas, wherein the oxygen and acetylene gas in the main starting material gas are controlled to be in a molar ratio of $0.9 \leq O_2/C_2H_2 \leq 1$, and the nucleation density of the diamond formed on the substrate is controlled to be $10^2$ to $1 \times 10^5$ cm$^{-2}$.

A second preferred embodiment of the diamond crystal forming method of the present invention is characterized by a method for forming the above tabular diamond crystal by CVD method carried out using a starting material gas comprised of at least one kind of gas and including elements of hydrogen, carbon and oxygen, wherein a carbon source in the starting material gas is controlled to be in a concentration of 0.01 to 10%, the number of oxygen atoms and that of carbon atoms in the starting material gas to be in a ratio of $0.5 \leq O/C \leq 1.2$, and the nucleation density of the diamond formed on the substrate to be $10^4$ to $2 \times 10^6$ cm$^{-2}$.

In the method for forming diamond crystal of the present invention, the CVD method may include plasma CVD method carried out using high frequencies, direct currents or microwaves as a source of excitation, and heat filament CVD method carried out using a heat filament as a source of excitation.

The method for forming diamond crystal of the present invention may also comprise the step of controlling the substrate to have a temperature of from 400° to 900° C. to form a tabular diamond crystal whose top surface has a {111} plane; and the step of controlling the substrate to have a temperature of from 950° to 1,300° C. to form a tabular diamond crystal whose top surface has a {100} plane.

The method may also comprise the step of implanting boron ions or carbon ions in the substrate at its predetermined region and thereafter carrying out the method described above, to selectively form a tabular diamond crystal at the predetermined region on the substrate.

The present invention will be described below in detail.

FIG. 1 diagrammatically illustrates a cross-section of a tabular diamond crystal of the present invention, and FIG. 2 a cross-section of a conventional granular diamond crystal.

In FIG. 1, reference numeral 1 denotes a substrate, on the top surface of which a tabular diamond crystal 2 of the present invention is formed. In this tabular diamond crystal 2, the ratio of length (height) h in the direction perpendicular to the substrate surface to length (width or breadth) l in the direction of substrate surface is 1:4 or more, usually 1:4.5 or more, and preferably from 1:5 to 1:1,000. The substrate surface 2a and the top surface 2a of the crystal are at an angle θ of 10° or less, and preferably 5° or less.

The diamond crystal having such a form is herein referred to as the tabular diamond crystal.

The conventional granular diamond crystal, designated by reference numeral 4 as shown in FIG. 2, has a ratio of height h to breadth l of 1:3 or less, and usually 1:2 or less. Reference numeral 3 denotes a substrate.

The diamond crystal having such a form is herein referred to as the granular diamond crystal. Here, the surface of the grain and the substrate 3 are at an angle θ that is usually formed at random. (On a nickel substrate and a cobalt substrate, the crystal has an epitaxial relation to the orientation of the underlying substrate.)

The mechanism of growth of the tabular diamond crystal according to the present invention is unclear in detail. Conditions under which this tabular diamond crystal is synthesized are conditions by which diamond crystals with a very high quality are synthesized. Taking account of this fact, the mechanism can be presumed to be, for example, as follows: In a condition for the synthesis of high-quality crystals, hydrogen radicals and OH radicals that act as etching gas for diamond crystals are present in a large number, so that the growth rate on the top surfaces of crystals is restrained and on the other hand the growth rate on the sides of crystals is not so restrained because of a decrease in the effect of etching (the reason therefor is that the quantity of hydrogen radicals or OH radicals per unit area decreases on the sides, or that gas species having lost their function as etching gas are present in a large quantity because of their collision against substrates or the like) and hence the crystals grow only on the sides.

The top surface of the tabular diamond crystal of the present invention has {111} plane having a trigonal or hexagonal morphology, or {100} plane having a tetragonal or octagonal morphology. The side is formed of {111} plane or {100} plane.

Changes of this morphology depend on substrate temperature kept during the formation of crystals. The top surface comes to mainly have the trigonal or hexagonal {111} plane when the substrate temperature is kept at 400° C. or above to 900° C. or below, and preferably 600° C. or above to 750° C. or below. The top surface comes to have the tetragonal or octagonal {100} plane when the substrate temperature is kept at 950° C. or above to 1,300° C. or below, and preferably 1000° C. or above to 1,200° C. or below. When a carbon source is in a low concentration in a diamond synthesis atmosphere, the top surface tends to have {111} plane and, when it is in a high concentration, the top surface tends to have {100} plane.

The tabular diamond crystal of the present invention is a monocrystal, or a twinned crystal in which a twin plane has been formed in the tabular body. In particular, most of tabular diamond crystals formed at a substrate temperature of 400° C. or above to 900° C. or below, whose top surfaces are {111} planes, have twin planes formed on the top surfaces in parallel. This occurs because of the reentrant angle formed as a result of the formation of the twin plane, and is presumed to be due to the action of what is called the reentrant angle effect, which readily promotes the growth of a crystal in the direction where the reentrant angle is present, to progress the formation of the tabular diamond crystal. The twin plane formed on the top surface in parallel is not limited to one plane, and two or more planes may be formed.

The formation of the tabular diamond crystal of the present invention on the substrate is carried out by gas phase synthesis.

The gas phase synthesis includes known CVD method, and combustion flaming method.

The CVD method may include thermal filament CVD method, microwave plasma CVD method, magnetic field microwave plasma CVD method, direct current plasma CVD method and RF plasma CVD method.

The carbon source of the starting material gas used in the gas phase synthesis may include hydrocarbon gasses such as methane, ethane, ethylene and acetylene, liquid organic compounds such as alcohols and acetone, carbon monoxide, and carbon chlorides, any of which may be used and to which a gas containing hydrogen, oxygen, chlorine or fluorine may be further appropriately added.

(1) Formation of tabular diamond crystal by CVD method:

The starting material gas is required to contain at least hydrogen, carbon and oxygen elements. One kind of starting material gas containing all the above elements may be used or plural kinds of starting material gasses containing any of the elements may be used in combination. In this case, the carbon source concentration in the starting material gas must be or less. The carbon source concentration herein referred to is expressed as follows:

$$\frac{\left(\begin{array}{c}\text{Carbon source gas}\\\text{flow rate}\end{array}\right) \times \left(\begin{array}{c}\text{Number of carbon atoms}\\\text{in carbon source gas}\end{array}\right)}{\text{Total starting material gas flow rate}} \times 100$$

Total starting material gas flow rate The number of carbon atoms in the carbon source gas is 1 in the case of, e.g., methane ($CH_4$), 3 in the case of propane ($C_3H_8$), and 3 in the case of acetone ($CH_3COCH_3$). The reason why this carbon source concentration is controlled to be 10% or less is that the degree of supersaturation of diamond crystal is controlled to restrain the crystal growth particularly in the direction of height. There is no particular lower limit, but use of a carbon source in a concentration less than 0.01% may make it impossible to achieve a practical rate of formation of the tabular diamond crystal.

In the CVD method, the number of oxygen atoms and that of carbon atoms in the starting material gas is controlled to be in a ratio (O/C) of $0.5 \leq O/C \leq 1.2$, and preferably $0.7 \leq O/C \leq 1.1$. If the O/C ratio is less than 0.5, their addition can not be effective, and on the other hand if it is more than 1.2 no practically usable diamond crystal formation rate can be achieved because of the etching effect of oxygen. To control the above O/C value, a gas for adding oxygen as exemplified by $O_2$, $H_2O$ or $N_2O$ may be added in the starting material gas.

In the case when an oxygen-containing organic compound such as alcohol is used as the carbon source, the tabular diamond crystal can be formed even if the O/C value is relatively low. For example, in the case when hydrogen and ethanol ($C_2H_5OH$) are used as the starting material gas, their use in a O/C ratio of 0.5 enables formation of tabular diamond crystals with a good quality. Details of the reason therefor are unclear. It is presumed that the oxygen-containing organic compound can readily form active species of oxygen (OH radicals or the like).

In the CVD method, known heat filament CVD method or microwave plasma CVD method may be carried out at a pressure of 1 to 1,000 Tort in the surrounding gas in which the oxygen atom number and carbon atom number has been controlled to be in the O/C ratio of the above range. Known magnetic field microwave plasma CVD method may also be carried out at a pressure ranging from 0.01 to 10 Tort to form the tabular diamond crystal.

The tabular diamond crystal of the present invention is formed only when the nucleation density is relatively low. In the cases of plasma CVD and heat filament CVD method, the tabular diamond crystal is formed only when it is $2 \times 10^6$ cm$^{-2}$. Details of the reason therefor are unclear. It is presumed as follows: The formation of the tabular diamond crystal of the present invention requires a sufficient quantity of etching gas (hydrogen radicals or OH radicals) in order to restrain the growth in the quantity of active species ($CH_x$ radical species, etc.) height direction, and also requires that a sufficient pertaining to diamond formation reach the side, too, in order to promote the growth in the lateral direction. Hence the nucleation density must be made lower.

(2) Formation of tabular diamond crystal by combustion flaming method:

In the combustion flaming method, oxygenacetylene flame is used. The oxygen and acetylene gas in this main starting material gas are controlled to be in a molar ratio of $0.9 \leq O_2/C_2H_2$, and preferably $0.95 \leq O_2/C_2H_2 \leq 0.99$. This makes it possible to obtain diamond crystals with a good reproducibility and also at a relatively high formation rate (several ten $\mu$m/hr, growth rate in breadth).

In the case of the combustion flaming method, the nucleation density of the diamond crystal is controlled to be $1 \times 10^5$ cm$^{-2}$ or less, and preferably from $1 \times 10^2$ to $1 \times 10^5$ cm$^{-2}$. In the combustion flaming method, in particular, the reason why the nucleation density must be lowered is that in the combustion flaming method the rate of growth of tabular diamond crystals in the lateral direction is higher by 10 times or mope (several ten $\mu$m/hr) than that in heat filament CVD method or microwave plasma CVD method. In heat filament CVD method or microwave plasma CVD method as well, the nucleation density must be appropriately lowered so that the intervals of tabular diamond crystals can be sufficiently broad, when tabular diamond crystals with a wide breadth are formed. The necessary intervals can not be absolutely defined, but may be those substantially corresponding to the breadth of each tabular diamond crystal intervals of 10 $\mu$m when the breadth is 10 $\mu$m).

The nucleation density can be controlled by utilizing various known methods as shown below.

First, the nucleation density in the case when mirror-finished Si crystal substrates are used is about $10^4$ cm$^{-2}$. In instances in which, however, substrates have been thoroughly cleaned (for example, cleaned with hydrofluoric acid after boiling in sulfuric acid-hydrogen peroxide water), the nucleation density is about $10^2$ cm$^{-2}$.

On the other hand, in instances in which substrates have been treated with a hydrofluoric acid (1%)-ethyl alcohol solution, their surfaces can be modified with hydrocarbon, and the nucleation density increases to $10^5$ to $10^6$ cm$^{-2}$.

In instances in which a roughing treatment is applied to the substrate surfaces using silicon carbide or diamond abrasive grains, the nucleation density increases to $10^6$ to $10^9$ cm$^{-2}$. Etching the roughed substrate surfaces to a depth of several ten to several hundred nm by wet etching or dry etching brings about a decrease of nucleation density to $10^5$ to $10^7$ cm$^{-2}$.

The nucleation density can be controlled by the known methods described above. In the present invention, the nucleation density may be controlled by any other methods without limitation to the above methods. It, however, is required for the nucleation density to be set within the range as prescribed in the present invention.

Selective deposition of tabular diamond crystals will be described below.

The tabular diamond crystals of the present invention can be selectively formed on the desired regions on the substrate by the use of the following method.

First, boron ions or carbon ions are implanted in the desired regions on the substrate. Ion implantation can be carried out using a focusing ion beam apparatus to implant them in the desired regions on the substrate. An alternative method is to use an ion implantation apparatus to carry out ion implantation over the whole substrate surface on which a resist pattern has been formed, followed by removal of the resist pattern to produce ion-implanted regions side by side on the substrate. There are no particular limitations for the energy for the ion implantation, but an energy of from about 2 keV to about 2 MeV is usually used. The ion implantation may be carried out in a quantity of not less than $1 \times 10^{16}$ ions/cm$^2$, and preferably from $1 \times 10^{17}$ to $10^{20}$ ions/cm$^2$.

The reason why the tabular diamond crystals are selectively formed on the boron ion or carbon ion implanted regions is unclear in many respects. It can be considered due to the presence of, e.g., carbon or boron on the substrate surface, which promotes the reaction with carbon type active species (though depending on carbon source gas, CH$_3$ radical can be proposed) pertaining to the formation of diamond, and brings about an increase in the formation of diamond nuclei.

The tabular diamond crystals can be selectively deposited by the method disclosed in Japanese Patent Application Laid-open No. 2-30697 by the present inventors, provided that the method is by no means limited to it.

The method disclosed in Japanese-Patent Application Laid-open No. 2-30695 is a method comprising applying a roughing treatment to the whole surface of a substrate, and thereafter forming a mask in a pattern on the substrate, followed by etching to remove the mask to form the roughed regions in a pattern on the substrate surface. It is possible to use another method comprising providing a mask member in a pattern on a substrate, and applying a roughing treatment to the surface of the substrate, followed by etching to remove the mask formed in a pattern, to form roughed regions in a pattern. It is also possible to use a method comprising applying a roughing treatment to the surface of a substrate, and thereafter forming thereon a theremoresistant mask in a pattern to form roughed regions in a pattern.

The roughing treatment making use of diamond abrasive grains is by no means limited to a particular method, including, for example, methods in which the surface is abraded by use of diamond abrasive grains, ultrasonic treatment is effected or sandblast is effected. For example, a nucleation density of $10^7$ cm$^{-2}$ or more can be achieved when the surface of a Si monocrystalline substrate is roughed using diamond abrasive grains of 1 μm or smaller and a lateral-rubbing abrader. The ultrasonic treatment is carried out by putting a substrate in a liquid suspension in which abrasive Grains with particle diameters of 1 μm to 50 μm have been dispersed in a proportion of 0.1 to 1 G/10 ml, and applying thereto ultrasonic waves by a ultrasonic cleaning device for 5 minutes to 4 hours, and preferably 10 minutes to 2 hours, in approximation. A nucleation density of $10^7$ cm$^{-2}$ or more can also be achieved when this ultrasonic treatment is carried out.

An example in which the selective deposition of diamonds is carried out on a substrate to which a roughing treatment has been applied using diamond abrasive grains to form roughed regions in a pattern will be described with reference to the diagrammatic views FIGS. 6A to 6E.

Figure 6A:
FIGS. 6A, 6B, 6C, 6D and 6E show a flow sheet to illustrate selective deposition of the tabular diamond crystal.

First, using diamond abrasive grains, a roughing treatment is uniformly applied to the surface of a substrate 22 (FIG. 6A).

Figure 6B:
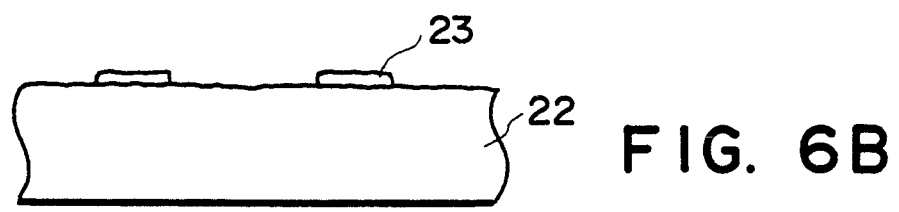

A mask 23 is formed on the surface of this substrate 22 (FIG. 6B). This mask may be made of any material, which may include, for example, a resist formed in a pattern by photolithography (lithograph printing by photography).

To form a diamond crystal formed of a single nucleus, each region of this mask must be made to have an area of 10 μm2 or less. If the area is more than 10 μm$^2$, a plurality of nuclei may be produced on this mask region to form a polycrystalline diamond.

Figure 6C:
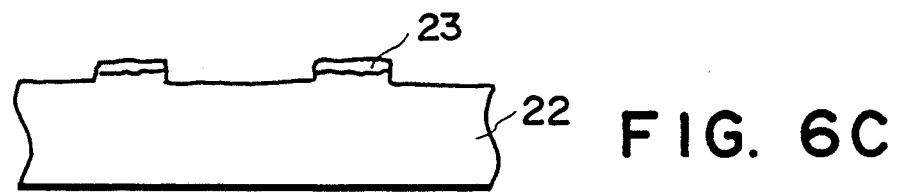
Figure 6D:

Next, the substrate 22 is etched via the mask 23 to form the roughed regions in a pattern (FIG. 6C). The etching may be either dry etching or wet etching. In the case of wet etching, it may include etching carried out using, e.g., a hydrofluoric acid-nitric acid mixed solution. In the case of dry etching, it may include plasma etching and ion beam etching. As etching gas used in the plasma etching, CF$_4$ gas, or CF$_4$ gas to which a gas such as oxygen or argon gas has been added may be used. As etching gas used in the ion beam etching, it is possible to use a rare gas such as Ar, He or Ne or a gas such as oxygen, fluorine, hydrogen or CF$_4$. The etching may preferably be carried out in a depth of 100 Å or more, preferably from 500 to 10,000 Å, and optimally from 800 to 2,000 Å, in approximation.

Figure 6E:
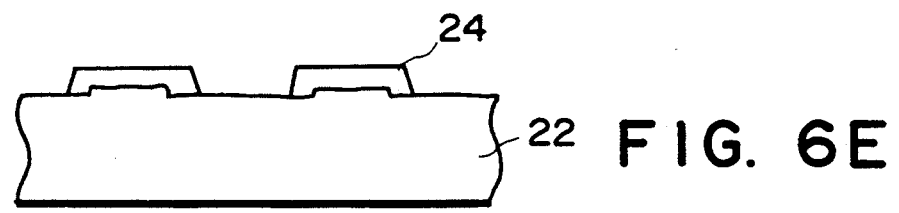

Then, the mask 23 is removed (FIG. 6D), and diamonds are formed under the conditions previously described, so that tabular diamond crystals 24 are selectively formed on the roughed regions (FIG. 6E).

A doping gas may be appropriately added in the starting material gas so that the tabular diamond crystal of the present invention can be used as a semiconductor material. As the doping gas, a gas containing boron, phosphorus, nitrogen, lithium or aluminum may be used.

The substrate on which the tabular diamond crystal is formed, used in the present invention, may include various substrates made of a semiconductor such as Si, Ge or GaAs, a high-melting metal such as W, Mo or Ta, an oxide such as SiO$_2$ or Al$_2$O$_3$ or a metal such as Cu, Ag, Au, Pt, Fe, Co, Ni, Cr or Ti. In particular, the tabular diamond crystal tends to be readily formed on a boron-containing substrate as exemplified by a substrate containing a variety of borides, a Si substrate doped with boron in a large quantity, or a substrate on which no carbide is easily formed as exemplified by a substrate made of Cu, Ag or Au or oxides such as $SiO_2$ or $Al_2O_3$.

Examples of the present invention will be described below with reference to the drawings

Example 1

In the present Example, the method of forming the tabular diamond crystal by combustion flaming method will be described with reference to FIG. 3.

FIG. 3 is a diagrammatic illustration of combustion flaming method carried out using an oxygen-acetylene flame burner. Reference numeral 5 denotes burner; 6, a substrate; 7, an inner flame; 8, an outer flame; and 9, a substrate holder. The substrate is cooled by water cooling.

As the substrate, Si monocrystalline substrates (1 cm square; boron-doped; specific resistance: 0.01 Ω.cm) were used.

$C_2H_2$ and $O_2$ gasses were flowed at a rate of 1.5 l/min and 1.4 l/min, respectively, and the substrate temperature was kept at 650° C. Synthesis time was set to be 30 minutes. The diamond crystals thus formed were tabular diamond crystals whose top surfaces had hexagonal {111} planes and wherein the ratio of height to breadth was 1:4 or more, and 1:4.7 on the average (average breadth: 25 μm). At this time the nucleation density was $2 \times 10^4$ cm$^{-2}$. The substrates and the top surfaces of crystals were at an angle of 10° or less.

Examples 2 and 3, Comparative Examples 1 to 3

Diamond crystals were formed in the same manner as in Example 1 except that the oxygen gas flow rate was changed (Examples 2 and 3, Comparative Example 1), or the nucleation density was increased (Comparative Examples 2 and 3) by carrying out ultrasonic treatment on the substrate surface in alcohol in which diamond abrasive grains had been dispersed. In Examples 2 and 3, in which the oxygen-acetylene ratio was 0.9 or more, tabular diamonds were formed.

In Comparative Example 1, in which the oxygen-acetylene ratio was less than 0.9, granular diamonds were formed. In Comparative Examples 2 and 3, in which the nucleation density was increased by ultrasonic treatment, granular diamonds or polycrystalline diamonds were formed.

In Examples 2 and 3, the top surfaces of tabular diamond crystals and the substrates were at an angle of 10° or less.

TABLE 1

| | Starting material gas (l/min) | Crystal breadth (μm) | Height-breadth ratio | Nucleation density (cm$^{-2}$) |
|---|---|---|---|---|
| Example: | | | | |
| 2 | $O_2$:1.45 $C_2H_2$:1.5 | 15 | 1:5.5 | $1.2 \times 10^4$ |
| 3 | $O_2$:1.35 $C_2H_2$:1.5 | 30 | 1:4.1 | $2.5 \times 10^4$ |
| Comparative Example: | | | | |
| 1 | $O_2$:1.3 $C_2H_2$:1.5 | 35 | 1:3.0 | $3 \times 10^4$ |
| 2 | $O_2$:1.4 $C_2H_2$:1.5 | 20 | 1:2.5 | $5 \times 10^5$ |
| 3 | $O_2$:1.4 $C_2H_2$:1.5 | — | *1 | $1 \times 10^6$ |

TABLE 1-continued

| Starting material gas (l/min) | Crystal breadth (μm) | Height-breadth ratio | Nucleation density (cm$^{-2}$) |
|---|---|---|---|
| $C_2H_2$:1.5 | | | |

*1: Polycrystalline film with a thickness of 25 μm

Example 4

Diamond crystals were formed in the same manner as in Example 1 except that the flow rate of cooling water for the substrate holder was controlled to keep the substrate temperature at 1,050° C. As a result, tabular diamond crystals were obtained, whose top surfaces had tetragonal {100} planes and wherein the ratio of height to breadth was 1:4.3 on the average and the breadth was 20 μm on the average. At this time the nucleation density was $2 \times 10^4$ cm$^2$. The top surfaces of tabular diamond crystals and the substrates were at an angle of 10° or less.

Example 5

In the present Example, the method of forming the tabular diamond crystal by heat filament CVD will be described with reference to FIG. 4.

FIG. 4 is a diagrammatic illustration of heat filament CVD carried out using a starting material gas composed of hydrogen and ethyl alcohol. Reference numeral 10 denotes a quartz reaction tube; 11, an electric furnace; 12, a filament made of tungsten; 13, a substrate; and 14, a starting material gas inlet to which a gas bomb, an alcohol vaporizing apparatus, a flow rate regulator and a valve (all not shown) are connected. Reference numeral 15 denotes a gas outlet connected to a valve, a pressure control valve and an exhaust system (comprising a turbo molecular pump to which a rotary pump is connected) (all not shown).

As the substrate, copper substrates (1 inch square; thickness: 0.5 mm; purity: 99.5%) were used.

As the starting material gas, $H_2$ and $C_2H_5OH$ were flowed at a rate of 200 ml/min and 1 ml/min, respectively, and the synthesis was carried out for 2 hours at a filament temperature of 2,000° C., a substrate temperature of 700° C. and a pressure of 760 Torr. The diamond crystals thus formed were tabular diamond crystals whose top surfaces had hexagonal. {111} planes and wherein the ratio of height to breadth was about 1:45 (average breadth: about 5 μm). At this time the nucleation density was $5 \times 10^5$ cm$^{-2}$. The top surfaces of tabular diamond crystals and the substrates were at an angle of 10° or less.

Example 6

In the present Example, the method of forming the tabular diamond crystal by microwave plasma CVD will be described with reference to FIG. 5.

Figure 5:
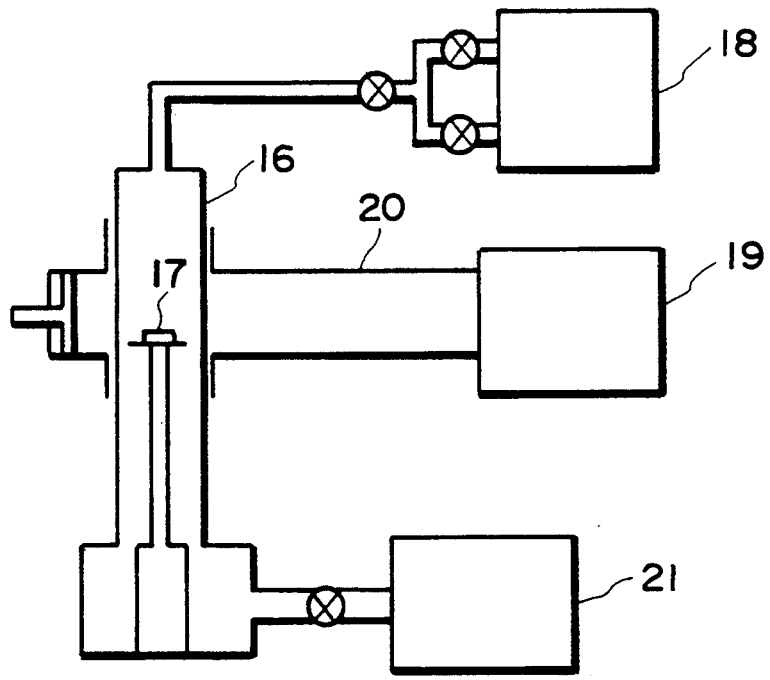
FIG. 5 is a diagrammatic illustration of a microwave plasma CVD apparatus used in the working of the present invention.

FIG. 5 is a diagrammatic illustration of microwave plasma CVD carried out using a starting material gas composed of hydrogen, methane and oxygen. Reference numeral 16 denotes a quartz reaction tube; 17, a substrate; and 18, a gas feed system in which a gas bomb and a flow rate regulator are incorporated. Reference numeral 19 denotes a microwave oscillator, which can apply microwaves of 2.45 GHz up to 1.5 kW at maximum. Reference numeral 20 denotes a microwave guide tube; and 21, an exhaust system to which a turbo molecular pump and a rotary pump are connected.

As the substrate, quartz substrates (15 mm square; thickness: 0.5 mm) were used.

As the starting material gas, $H_2$, $CH_4$ and $O_2$ were flowed at a rate of 200 ml/min, 2 ml/min and 0.7 ml/min, respectively, and the synthesis was carried out for 5 hours at a pressure of 100 Torr, a microwave output of 600 W and a substrate temperature of 680° C.

The diamond crystals formed under such conditions were tabular diamond crystals whose top surfaces had hexagonal {111} planes and wherein the ratio of height to breadth was about 1:46 (average breadth: about 4 μm). At this time the nucleation density was $8 \times 10^5$ $cm^{-2}$. The top surfaces of tabular diamond crystals and the substrates were at an angle of 10° or less.

Example 1

Diamond crystals were formed in the same manner as in Example 6 except that the microwave output and the substrate temperature were changed to 900 W and 980° C., respectively. As a result, tabular diamond crystals were formed, whose top surfaces had tetragonal {100} planes and wherein the ratio of height to breadth was 1:4.2 and the breadth was about 5 μm. At this time the nucleation density was $5 \times 10^5$ $cm^{-2}$. The top surfaces of tabular diamond crystals and the substrates were at an angle of 10° or less.

Examples 8 to 12, Comparative Examples 4 to 7

Diamond crystals were formed in the same manner as in Example 6 except that the starting material gas was replaced with a mixed gas of carbon monoxide and hydrogen and the carbon source concentration was changed (Examples 8 and 9, Comparative Example 4), or the O/C value was changed (Examples 10 to 12, Comparative Examples 5 and 6), or by carrying out ultrasonic treatment on the substrate surface in alcohol in which diamond abrasive grains had been dispersed, the nucleation density was increased (Comparative Example 7).

In Examples 8 and 9, in which the carbon source concentration in the starting material gas was 10% or less, tabular diamond crystals were formed, but in Comparative Example 4, in which it was more than 10%, granular diamonds were formed.

In Examples 10 to 12, in which the O/C was set within the range of $0.5 \leq O/C \leq 1.2$, tabular diamond crystals were formed, but in Comparative Example 6, in which it was less than 0.5, granular diamond crystals were formed, and in Comparative Example 5, in which the O/C was more than 1.2, no diamond was deposited.

In Comparative Example 7, in which the nucleation density was increased by ultrasonic treatment so as to be outside the scope of the present invention, granular diamonds were formed even though the O/C value was satisfied.

In Examples 8 to 12, the top surfaces of tabular diamond crystals and the substrates were at an angle of 10° or less.

TABLE 2

| | Starting material gas (ml/min) | Crystal breadth (μm) | Height-breadth ratio | Nucleation density $(cm^{-2})$ |
|---|---|---|---|---|
| Example: | | | | |
| 8 | $H_2$:200 CO:10 | 5 | 1:4.3 | $5 \times 10^5$ |
| 9 | $H_2$:200 CO:20 | 7 | 1:4.1 | $8 \times 10^5$ |
| Comparative Example: | | | | |
| 4 | $H_2$:200 CO:25 | 8 | 1:2.9 | $1 \times 10^5$ |
| Example: | | | | |
| 10 | $H_2$:200 $CH_4$:2 $O_2$:0.5 | 6 | 1:4.0 | $2 \times 10^6$ |
| 11 | $H_2$:200 $CH_4$:2 $O_2$:0.9 | 3 | 1:5.0 | $1 \times 10^5$ |
| Example: | | | | |
| 12 | $H_2$:200 $CH_4$:5 $O_2$:3 | 1.5 | 1:5.0 | $2 \times 10^5$ |
| Comparative Example: | | | | |
| 5 | $H_2$:200 $CH_4$:5 $O_2$:3.5 | Not deposited | — | — |
| 6 | $H_2$:200 $CH_4$:2 $O_2$:0.4 | 7 | 1:2.8 | $2 \times 10^6$ |
| 7 | $H_2$:200 $CH_4$:2 $O_2$:0.7 | 4 | 1:2.5 | $5 \times 10^6$ |

Example 13

In the present Example, the selective deposition of the tabular diamond crystals will be illustrated.

As the substrate, a Si monocrystalline substrate (diameter: 1 inch; thickness: 0.5 mm; specific resistance: 100 Ω.cm or above) was used. In this substrate, boron ions ($B^+$ ions) were implanted at an accelerating voltage of 20 keV using a focusing ion beam (FIB) apparatus. They were implanted in regions of 3 μm square each and at intervals of 20 μm pitch, and implanted in a quantity of $1 \times 10^{17}$ ions/cm.

On this substrate, diamonds were formed in the same manner as in Example 6. As a result, tabular diamond crystals were selectively formed in the regions in which boron ions had been implanted.

The tabular diamond crystals thus obtained were crystals whose top surfaces had hexagonal {111} planes and wherein the ratio of height to breadth was about 1:4.5 and the breadth was about 4 μm. The top surfaces of tabular diamond crystals and the substrate were at an angle of 10° or less.

Example 14

In the present Example, another selective deposition of the tabular diamond crystals will be illustrated.

As the substrate, the same Si monocrystalline substrate as that in Example 13 was used.

On this substrate, a resist pattern was formed at intervals of 20 μm pitch by a resist pattern formation process using a photolithogaphic apparatus to uncover 2.5 μm square Si surfaces. Using an ion implantation apparatus, carbon ions ($C^+$ ion) were implanted in this substrate over the whole surface thereof at an accelerating voltage of 10 keV and an ion implantation quantity of $2 \times 10^{17}$ $ions/cm^2$. After the ions had been implanted, the resist pattern was removed, followed by formation of diamonds in the same manner as in Example 6. As a result of the formation of diamonds, tabular diamond crystals were selectively formed in the regions having been uncovered on the Si surface at the time of the ion implantation.

The tabular diamond crystals thus obtained were crystals whose top surfaces had hexagonal {111} planes and wherein the ratio of height to breadth was about 1:4.5 and the breadth was about 4 μm. The top surfaces of tabular diamond crystals and the substrate were at an angle of 10° or less.

Example 15

In the present Example, still another selective deposition of the tabular diamond crystals will be illustrated.

First, a quartz substrate (25 mm diameter×0.5 mm thick) was put in alcohol in which diamond abrasive grains with an average particle diameter of 15 μm had been dispersed, to carry out surface-roughing treatment using an ultrasonic cleaning device.

Subsequently, on this substrate, a PMMA-based resist pattern with a diameter of 2 μm was formed at intervals of 15 um pitch by using a mask aligner.

This substrate was etched in a depth of about 1,000 Å using an Ar ion beam etching apparatus. Here, the etching was carried out at an accelerating voltage of 1 kV for an etching time of 10 minutes.

Then the resist was removed using an organic solvent, followed by formation of diamonds in the same manner as in Example 8. As a result, tabular diamond crystals were selectively formed only in the regions in which the resist pattern had been formed (the unetched regions).

The tabular diamond crystals thus obtained were crystals whose top surfaces had hexagonal {111} planes and wherein the ratio of height to breadth was about 1:4.5 and the breadth was about 6 μm. The top surfaces of tabular diamond crystals and the substrate were at an angle of 10° or less.

As having been described in detail, the present invention makes it possible to obtain tabular diamond crystals whose top surfaces are substantially parallel to the substrates and wherein the ratio of height to breadth is 1:4 or more. Such tabular diamond crystals can be excellent materials, in particular, for electronic materials.

What is claimed is:

1. A method for forming diamond crystal comprising forming a diamond tabular crystal by combustion flame method carried out using oxygen and acetylene gas as a main starting material gas, wherein the oxygen and acetylene gas in the main starting material gas are controlled to be in a molar ratio of $0.9 \leq O_2/C_2H_2 \leq 1$, and the nucleation density of the diamond formed on a substrate is controlled to be $10^2$ to $1 \times 10^5$ cm$^{-2}$.

2. A method for forming diamond crystal comprising forming a tabular diamond crystal by a plasma CVD method or by a heat filament CVD method carried out using a starting material gas comprised of at least a carbon source gas and containing elements of hydrogen, carbon and oxygen, wherein the carbon source gas in the starting material gas is controlled to be in a concentration of 0.01 to 10%, as defined by the carbon source gas flow rate times the number of carbon atoms in the carbon source gas times 100/total starting material gas flow rate, the number of oxygen atoms and that of carbon atoms in the staring material gas to be in a ratio of $0.5 \leq O/C \leq 1.2$, and the nucleation density of the diamond formed on a substrate is controlled to be $10^4$ to $2 \times 10^6$ cm$^{-2}$.

3. The method for forming diamond crystal according to claim 2, wherein said plasma CVD method is carried out using radio frequencies, direct currents or microwaves as a source of excitation, or said heat filament CVD method carried out using a heat filament as a source of excitation.

4. The method for forming diamond crystal according to claim 1 or 2, wherein the substrate temperature is controlled to be from 400° C. to 900° C. to form said tabular diamond crystal whose top surface has a {111} plane.

5. The method for forming diamond crystal according to claim 1 or 2, wherein the substrate temperature is controlled to be from 950° to 1,300° C. to form said tabular diamond crystal whose top surface has a {100} plane.

6. The method for forming diamond crystal according to claim 1 or 2, wherein boron ions or carbons ions are implanted in the substrate at a preselected region and thereafter selectively forming said tabular diamond crystal at the preselected region on the substrate.

* * * * *

UNITED STATES PATENT AND TRADEMARK OFFICE
CERTIFICATE OF CORRECTION

PATENT NO. : 5,445,851
DATED : August 29, 1995
INVENTOR(S) : KEIJI HIRABAYASHI, ET AL.

It is certified that error appears in the above-identified patent and that said Letters Patent is hereby corrected as shown below:

ON TITLE PAGE

In [56] References Cited, under U.S. PATENT DOCUMENTS:
     "5,026,415  6/1992  Yamamoto et al." should read
     --5,026,415  6/1991  Yamamoto et al.--.

COLUMN 1

Line 33, "There are those formed" should read
       --In the formation of--.
   Line 53, "substrates" should read --substrates which are--.
       (2nd occurrences)

COLUMN 4

Line 9, "10°" should read --10°--.

COLUMN 5

Line 5,  "progress" should read --promote--.
   Line 19, "gasses" should read --gases--.
   Line 32, "gasses" should read --gases--.
   Line 34, "be or" should read --be 10% or--.
   Line 43, "Total starting material gas flow rate The"
       should read --¶ The--.

COLUMN 6

Line 2,  "a" should read --an--.
   Line 10, "Tort" should read --Torr--.
   Line 15, "Tort" should read --Torr--.
   Line 26, "in the quantity" should read --in the height
       direction, and also requires that a sufficient
       quantity--.

UNITED STATES PATENT AND TRADEMARK OFFICE
CERTIFICATE OF CORRECTION

PATENT NO. : 5,445,851
DATED : August 29, 1995
INVENTOR(S) : KEIJI HIRABAYASHI, ET AL.

It is certified that error appears in the above-identified patent and that said Letters Patent is hereby corrected as shown below:

COLUMN 6

Line 27, "height direction, and also requires that" should be deleted.
Line 28, "a sufficient" should be deleted.
Line 34, "oxygenacetylene" should read --oxygen-acetylene--.
Line 37, "$O_2/C_2H_2$," should read --$O_2/C_2H_2 \leq 1$,--.

COLUMN 7

Line 5, "$10^6$cm-2." should read --$10^6$cm$^{-2}$.--.
Line 54, "No. 2-30695" should read --No. 2-30692--.

COLUMN 8

Line 11, "Grains" should read --grains--.
Line 13, "1 G/10 ml," should read --1g/10 ml,--.
Line 35, "10 μm2" should read --10 μm$^2$--.

COLUMN 10

Line 45, "Tort." should read --Torr.--.

COLUMN 11

Line 6, "Tort," should read --Torr,--.

COLUMN 14

Line 18, "staring" should read --starting--.
Line 19, "0/C" should read --O/C--.

UNITED STATES PATENT AND TRADEMARK OFFICE
CERTIFICATE OF CORRECTION

PATENT NO. : 5,445,851

DATED : August 29, 1995

INVENTOR(S) : KEIJI HIRABAYASHI, ET AL.

It is certified that error appears in the above-identified patent and that said Letters Patent is hereby corrected as shown below:

COLUMN 14

Line 39, "carbons" should read --carbon--.

Signed and Sealed this

Thirteenth Day of February, 1996

Attest:

BRUCE LEHMAN

Attesting Officer  Commissioner of Patents and Trademarks